US008685221B1

(12) United States Patent
Cohen

(10) Patent No.: US 8,685,221 B1
(45) Date of Patent: *Apr. 1, 2014

(54) ENHANCED ELECTROCHEMICAL DEPOSITION FILLING

(71) Applicant: Uri Cohen, Palo Alto, CA (US)

(72) Inventor: Uri Cohen, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/690,292

(22) Filed: Nov. 30, 2012

Related U.S. Application Data

(63) Continuation of application No. 11/827,829, filed on Jul. 13, 2007, now Pat. No. 8,349,149, which is a continuation of application No. 11/085,971, filed on Mar. 21, 2005, now Pat. No. 7,247,563, which is a continuation of application No. 10/112,332, filed on Mar. 29, 2002, now Pat. No. 6,869,515.

(60) Provisional application No. 60/280,325, filed on Mar. 30, 2001.

(51) Int. Cl.
| | | |
|---|---|---|
| *C25D 21/10* | (2006.01) | |
| *C25D 7/12* | (2006.01) | |
| *C25D 5/08* | (2006.01) | |
| *C25D 5/02* | (2006.01) | |
| *H01L 21/288* | (2006.01) | |
| *H05K 3/42* | (2006.01) | |
| *H01L 21/768* | (2006.01) | |

(52) U.S. Cl.
CPC ............... *C25D 21/10* (2013.01); *C25D 7/123* (2013.01); *C25D 5/028* (2013.01); *C25D 5/08* (2013.01); *H01L 21/2885* (2013.01); *H01L 21/7688* (2013.01); *H05K 3/423* (2013.01)
USPC ........... 205/148; 205/157; 205/133; 205/118; 205/123

(58) Field of Classification Search
None
See application file for complete search history.

(56) References Cited

U.S. PATENT DOCUMENTS

| | | | |
|---|---|---|---|
| 4,304,641 A | 12/1981 | Grandia et al. | |
| 4,771,111 A | 9/1988 | Tieke et al. | |
| 4,834,842 A | 5/1989 | Langner et al. | |
| 5,368,634 A | 11/1994 | Hackett | |
| 5,421,987 A | 6/1995 | Tzanavaras et al. | |

(Continued)

OTHER PUBLICATIONS

Chiu et al, "Characterization of additve systems for damascene Cu electroplating by the superfilling profile monitor" Journal of Vacuum Science & Technology B, Nov./Dec. 2000, vol. 18, pp. 2835-2841.*

(Continued)

*Primary Examiner* — Harry D Wilkins, III

(57) ABSTRACT

One embodiment is a method for void-free metallic electrofilling inside openings, said method includes: providing a substrate with at least one opening, the substrate includes an electrically conductive surface, including inside the at least one opening; immersing the substrate in an electrolyte contained in an ECD cell, the ECD cell includes at least one anode and a cathode, the cathode includes at least a portion of the conductive surface, the electrolyte includes plating metallic ions and at least one inhibitor additive, said metallic ions and at least one inhibitor additive having concentrations; providing electrolyte agitation across the substrate surface; and applying electroplating current density to the substrate; wherein the agitation, the concentrations, and the electroplating current density are such to produce void-free metallic electrofilling of the at least one opening, and wherein a height of electrodeposited surface bumps, or transition steps or humps, or transition spikes, is less than 140 nm.

36 Claims, 9 Drawing Sheets

SEM of Lightly etched cross section. Filled trenches:
~0.05μm wide (bottom); ~1.41μm deep; AR ~ 28:1

(56) References Cited

U.S. PATENT DOCUMENTS

| | | | |
|---|---|---|---|
| 5,544,773 | A | 8/1996 | Haruta et al. |
| 5,904,827 | A | 5/1999 | Reynolds |
| 6,080,291 | A | 6/2000 | Woodruff et al. |
| 6,176,992 | B1 | 1/2001 | Talieh |
| 6,179,983 | B1 | 1/2001 | Reid et al. |
| 6,228,232 | B1 | 5/2001 | Woodruff et al. |
| 6,258,220 | B1 | 7/2001 | Dordi et al. ............ 204/198 |
| 6,280,641 | B1 | 8/2001 | Gaku et al. |
| 6,333,560 | B1 | 12/2001 | Uzoh ............ 257/774 |
| 6,334,937 | B1 | 1/2002 | Batz et al. ............ 204/212 |
| 6,344,129 | B1 | 2/2002 | Rodbell et al. ............ 205/291 |
| 6,399,479 | B1 | 6/2002 | Chen et al. ............ 438/628 |
| 6,416,647 | B1 | 7/2002 | Dordi et al. |
| 6,423,200 | B1 | 7/2002 | Hymes |
| 6,432,821 | B1 | 8/2002 | Dubin et al. |
| 6,534,116 | B2 | 3/2003 | Basol |
| 6,790,776 | B2 | 9/2004 | Ding et al. ............ 438/685 |
| 2002/0000383 | A1 | 1/2002 | Lee |
| 2002/0020621 | A1 | 2/2002 | Uzoh et al. |
| 2002/0189637 | A1 | 12/2002 | Downes et al. |

OTHER PUBLICATIONS

Jordan et al, "The effect of inhibitor transport on leveling in electrodeposition", Journal of the Electrochemical Society, vol. 138, No. 5, May 1991, pp. 1251-1259.*

Takahashi et al, "Transport Phenomena that control electroplated copper filling of submicron vias and trenches", Journal of the Electrochemical Society, Vo. 146, No. 12, pp. 4499-4503.*

A. A. Sonin, "Jet Impingement Systems for Electroplating Applications: Mass Transfer Correlations", J. Electrochem. Soc., vol. 130(7), Jul. 1983, pp. 1501-1505.

D. T. Schwartz et al., "Mass-Transfer Studies in a Plating Cell with a Reciprocating Paddle", J. Electrochem. Soc., vol. 134(7), Jul. 1987, pp. 1639-1645.

G. Ritter et al., "Two- and three-dimensional numerical modeling of copper electroplating for advanced ULSI metallization", Solid-State Electronics, vol. 44 (2000), pp. 797-807.

M. Data et al., "Fundamental aspects and applications of electrochemical Microfabrication", Electrochimica Acta, vol. 45 (2000), pp. 2535-2558.

"Damascene Copper Electroplating for Chip Interconnections" by P. C. Andricacos et al., in IBM Journal of Res. and Develop., vol. 42, No. 5, Sep. 1998, pp. 567-574.

"Copper On-Chip Interconnections" by P. C. Andricacos in the Electrochemical Society Interface, pp. 32-37, Spring 1999.

"Factors Influencing Damascene Feature Fill Using Copper PVD and Electroplating" by J. Reid et al., in Journal of Solid State Technology, vol. 43(7), pp. 86-103, Jul. 2000.

"Superconformal Electrodeposition of Copper in 500-90 nm Features" by T. P. Moffat et al, in Journal of the Electrochemical Society, vol. 147(12), pp. 4524-4535, Dec. 2000.

A. R. Despic and K. I. Popov, "Transport-Controlled Deposition and Dissolution of Metals", in Modern Aspect of Electrochemistry, vol. 7, pp. 256-268, Plenum Press, N.Y. 1972.

E. H. Lyons, "Fundamental Principles", in Modern Electroplating, 3rd Edition, edited by F. A. Lowenheim, pp. 31-36, John Wiley & Sons, 1974.

J. Jorne, "Challenges in Copper Interconnect Technology", Semiconductor Fabtech—11th Edition, pp. 267-271, Feb. 2000.

U. Cohen and G. Tzanavaras, "Seed Layers and Cu Jets Plating for Interconnects Below 0.10 Micron", 17th VMIC Conf., pp. 21-26, Santa Clara, California, Jun. 2000.

M. Matlosz, "Competitive Adsorption Effects in the Electrodeposition of Iron-Nickel Alloys", J. Electrochem. Soc. vol. 140(8), Aug. 1993, pp. 2272-2279.

P. C. Andricacos et al., "Electrodeposition of Nickel-Iron Alloys", J. Electrochem. Soc. vol. 136(5), May 1989, pp. 1336-1340.

U. Cohen et al., "Silicon Epitaxial Growth by Electrodeposition from Molten Salts", Journal of the Electrochemical Society, vol. 123(3), pp. 381-383, Mar. 1976.

T. Kessler and R. Alkire, "A Model for Copper Electroplating of Multilayer Printed Wiring Boards", J. Electrochem. Soc., vol. 123(7), Jul. 1976, pp. 990-999.

* cited by examiner $$\Delta X_1 \gg \Delta X_2$$
$$\Delta C_2 \gg \Delta C_1$$

$V_{F1} \gg V_{F2}$

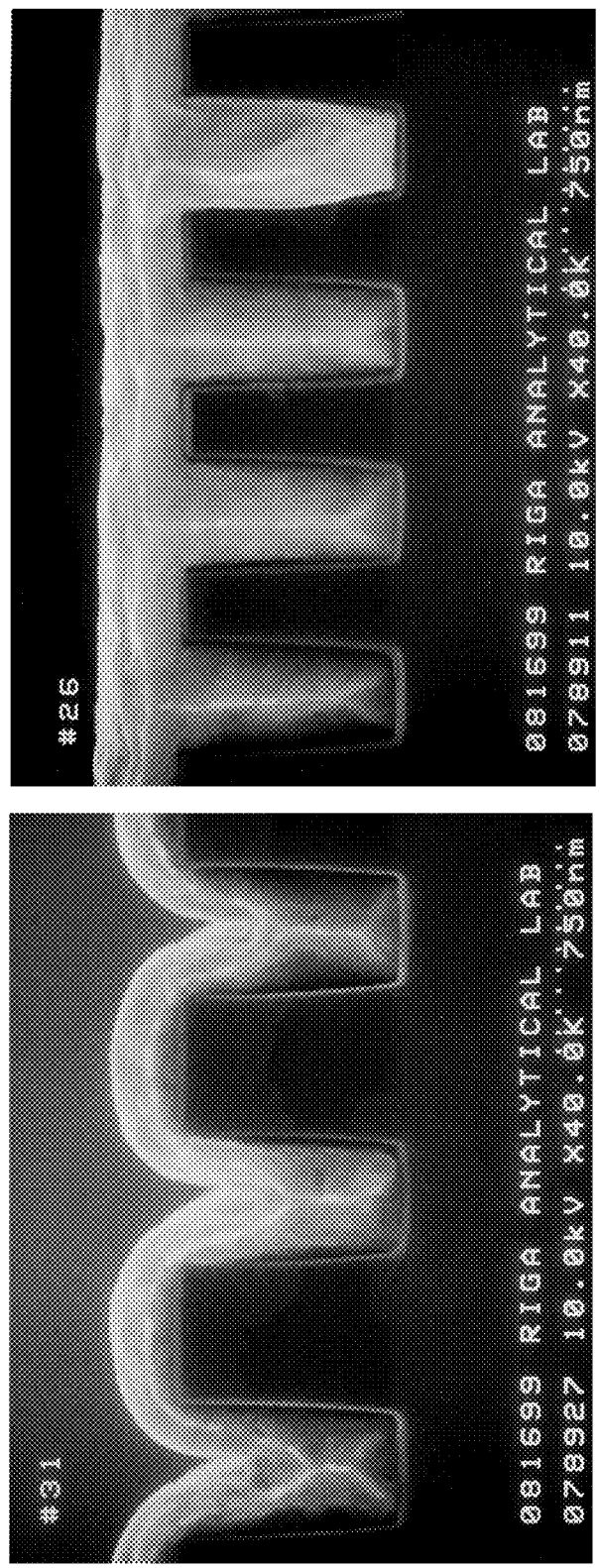
Figure 4 Cleaved samples plated at 120 mA/cm$^2$, showing superfilled trenches after: (a) partial filling, and (b) complete filling.

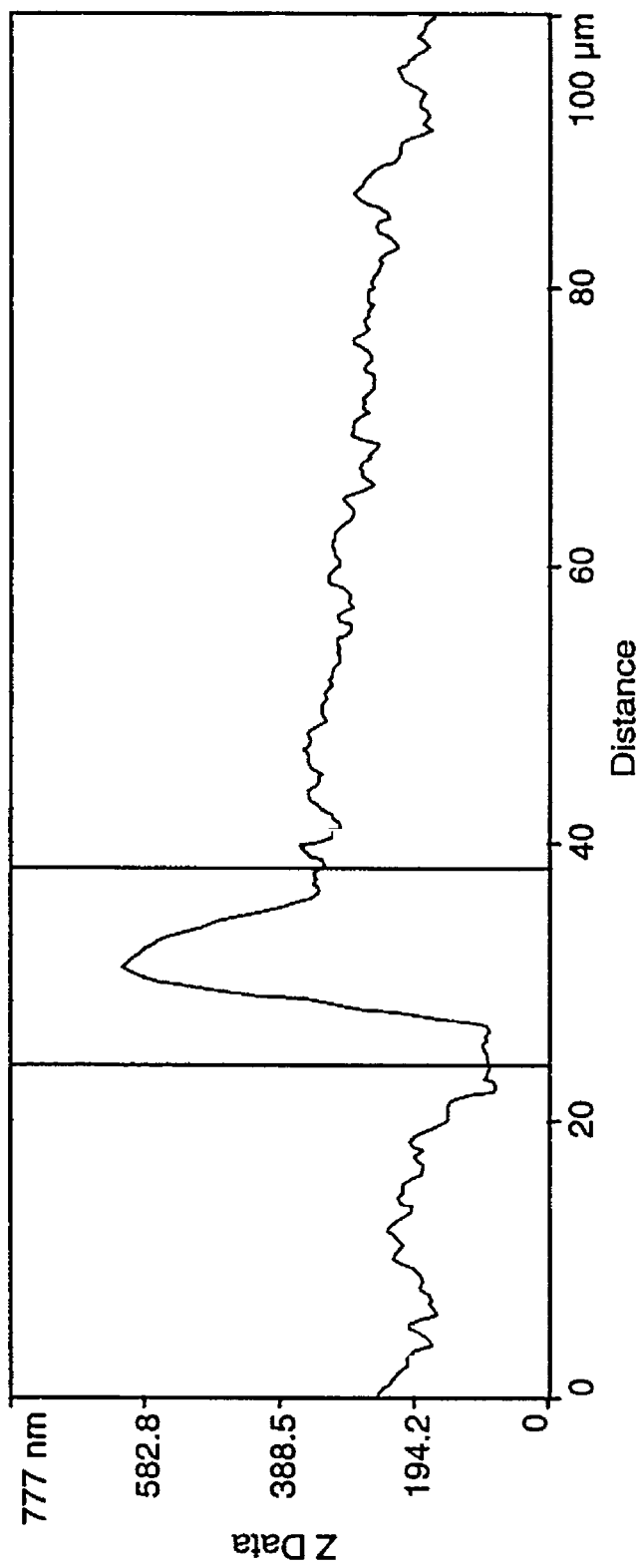
Figure 5 (Prior Art). AFM profile scan: field to 0.35/0.35μm S/L trench array. Wafer plated by a leading vendor's prior art ECD tool.

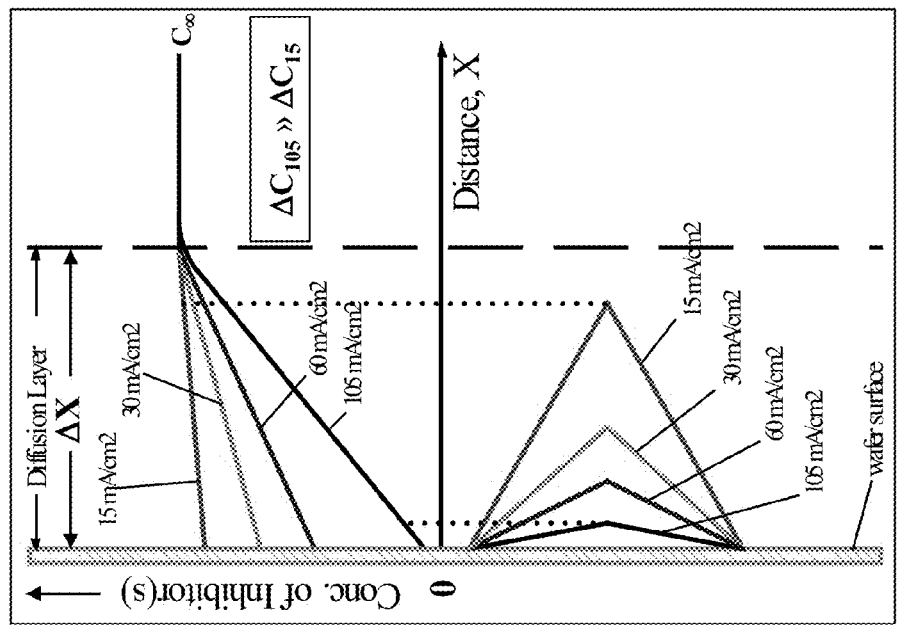
Figure 6 Inhibition Model of brightening mechanism.

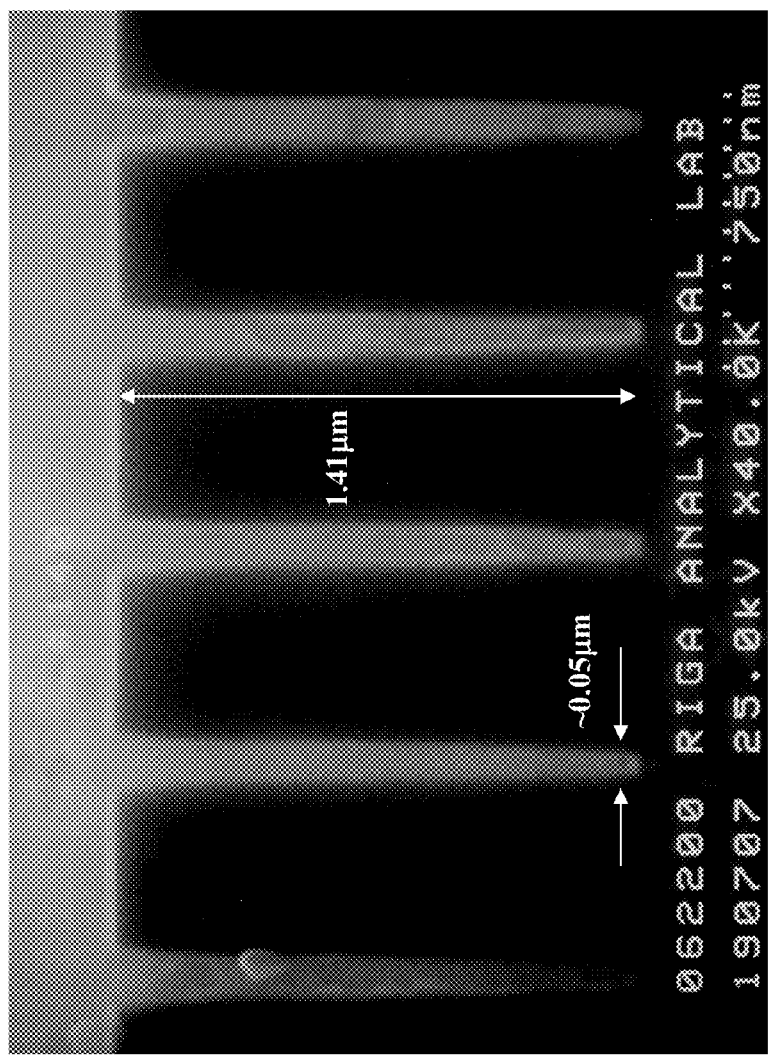
Figure 7. SEM of Lightly etched cross section. Filled trenches: ~0.05µm wide (bottom); ~1.41µm deep; AR ~ 28:1

ENHANCED ELECTROCHEMICAL DEPOSITION FILLING

This is a continuation of application Ser. No. 11/827,829, filed on Jul. 13, 2007, now U.S. Pat. No. 8,349,149, which is a continuation of application Ser. No. 11/085,971, filed on Mar. 21, 2005, now U.S. Pat. No. 7,247,563, which is a continuation of application Ser. No. 10/112,332, filed on Mar. 29, 2002, now U.S. Pat. No. 6,869,515, which itself claims the benefit under 35 U.S.C. 119(e) of U.S. Provisional Application No. 60/280,325 filed on Mar. 30, 2001.

BACKGROUND OF THE INVENTION

1. Field of the Invention

This invention relates to the field of metal or alloy electrochemical deposition (ECD) for filling narrow and high aspect ratio openings. In particular, the invention discloses new methods which enhance reliable, fast, and void-free filling of very small openings, with large aspect ratios, such as vias and trenches in semiconductor devices, thin film heads, electronic high density packages, or micro electromechanical system (MEMS) devices. The new methods are particularly effective for the so called "Damascene" and "Dual Damascene" copper interconnects, providing fast, reliable, and void-free copper filling by electroplating inside vias and trenches in the manufacture of semiconductor devices.

2. Description of the Prior Art

There are two methods to fill patterned openings by electroplating. In one method, an insulating mask such as an oxide, photoresist, or polyimide layer is patterned over a conductive metallic surface (or a "seed layer" or "plating base"), exposing the metallic surface only at the bottom of the openings. Electroplating is carried out through the openings in the insulating mask, and is confined inside the openings of the mask. Usually, following the plating, the insulating mask is removed and the seed layer (which was covered by the insulating mask) is etched away. This method is often used in the fabrication of, for example, coils and other metallic structures of thin film heads, metallic conductors in high density packages, and in MEMS devices.

In the other method, sometimes referred to as "Damascene" or "Dual Damascene", an insulating (or dielectric) layer is first pattern-etched to form openings in it. Next, at least one metallic layer is deposited over the insulating layer to metallize its top surface (field), as well as the sidewalls and bottom surfaces of the openings. The metallic layer(s) serves as a conductive plating base (or "seed-layer"), to provide low resistive electric path for the electroplating current. Electroplating is then carried out over the entire metallized surface, including the field and inside the patterned openings. Following plating, the plated metal and any metallization (adhesion, barrier, or seed) layers above the field, as well as any excess plated metal over the openings, are removed by etching, polishing, or by chemical mechanical polishing (CMP). This results in metallic filled vias or trenches (or grooves), surrounded by a dielectric. This method is used, for example, to produce metallic interconnects in semiconductor integrated circuits devices.

Usually, when using electrolytes without surface active additives, the plating rate inside the openings is slower than at the field. Due to higher electric field at the top corners of the openings, the local current density (and plating rate) is higher at the top corners, leading to faster growth and pinching-off of the top corners. This leads to deleterious voids in the filling, as shown in FIG. 1. Also, during electroplating, the relatively stagnant electrolyte inside the openings results in poor replenishment and depletion of the plating ion there. This leads to slower plating rate inside the openings than over the field, resulting in voids in the filling (cf. FIG. 1). The plating ion depletion is more severe at the bottom of the openings, and less severe near the top corners. The plating ion concentration gradient produces increasing concentration polarization, which leads to a decreasing plating rate along the depth of the opening. These inherent void-forming problems become more severe with decreasing width and increasing aspect ratio of the openings. The higher the aspect ratio (AR) of the opening, the slower the plating rate inside it, relative to the field. These problems result in poor or incomplete (voids) filling of high AR openings (cf. FIG. 1).

Aspect ratio (AR) is defined herein (cf. FIG. 1) as the ratio between height (or depth), h, of an opening and its smallest lateral dimension, W (width of a trench, or diameter of a via):

$$AR = h/W$$

The openings may consist of, for example, vias or trenches (or grooves) in a dielectric layer, such as used in the fabrication of interconnects in semiconductor integrated circuit devices.

The filling problems become more severe with decreasing lateral dimension W and increasing AR of the openings. For example, in today's most advanced copper filling of trenches and vias in integrated circuit interconnects, the openings may have an aspect ratio as high as 8:1 (h=1.4 μm; W=0.18 μm), and future trench and via openings will likely require W≤0.10-0.13 μm, and AR≥10:1. Reliable, void-free filling of such narrow and high AR openings imposes a great deal of difficulty.

In order to overcome the natural tendency to form voids, commercial electrolytes, such as acidic copper sulfate, usually include proprietary surface active "brightener" and/or "leveler" additives. The proprietary additives usually comprise organic compounds with functional groups containing sulfur and/or nitrogen atoms. These compounds adsorb onto growth sites of the depositing metal surface, thereby inhibiting (or suppressing) the metal deposition rate. The adsorption and its associated inhibition lead to smaller (finer) grains of the depositing metal, thus producing smoother and brighter deposits. Leveling is obtained by higher concentration of inhibitor (or additives) at protrusion tips sticking into the diffusion layer, thereby inhibiting (or suppressing) their growth. As a result, inhibition is stronger at protrusions, compared with the flat surface. In much the same way, the relatively stagnant electrolyte inside narrow openings results in poor replenishment and depletion of the inhibitor there. This depletion results in reduced inhibition and faster growth inside the openings. Due to better supply of the inhibitor at the top corners and the field, inhibition is stronger at the top corners of openings and at the field (compared with inside the openings). The reduced inhibition inside narrow openings speeds up the plating rate there (relative to the field), thus facilitating void-free filling (or "superfilling") of narrow openings with large aspect ratios. The mechanism of superfilling narrow openings, using inhibiting additives, was proposed in several publications. For examples, see an article entitled: "Damascene copper electroplating for chip interconnects", by P. C. Andricacos, at al. in IBM Journal of Research and Development, Vol. 42(5), pp. 567-574, 1998, and an article entitled: "Copper On-Chip Interconnections", by P. C. Andricacos in The Electrochemical Society Interface, pp. 32-37, Spring 1999.

Clearly, in order to achieve void-free "superfilling" of narrow openings, the beneficial effect of inhibition gradients must overcome the intrinsic void-forming effects due to (a) higher electric field (and current density) at the top corners and, (b) decreasing plating rate inside openings along their depth due to depletion of the plating ion there.

As openings get narrower, and the aspect ratio increases, void-free ECD filling becomes harder and harder to control. While wider openings may fill well, narrower ones may have voids, and vice versa. For example, see an article entitled: "Factors Influencing Damascene Feature Fill Using Copper PVD and Electroplating", by J. Reid et al. in Journal of Solid State Technology, Vol. 43(7), pp. 86-103, July 2000. Process latitude, such as the useful range of additive concentration and/or plating rate, becomes very tight and hard to control.

Prior art ECD tools and methods commonly employ relatively slow laminar (or "natural") flow of electrolyte across the substrate's surface. For example, U.S. Pat. Nos. 6,080,291, 6,179,983, and 6,228,232 employ a perforated (or "diffusion") plate or a porous membrane, placed between the anode and cathode (substrate), in order to achieve laminar flow across the substrate's surface. Such flow results in a relatively thick diffusion layer. The thick diffusion layer limits the useful plating rate to only about 0.3-0.4 µm/min, thereby limiting the throughput of single-wafer plating modules. In addition, prior art Cu-plated wafers usually display relatively rough, matte or semi-matte, surfaces. The rough plated surfaces include protrusions or bumps over filled openings, as well as spikes (or "balloons") and steps (or "humps") at boundaries between the field and patterned arrays of narrow openings (cf. FIG. 5). Such spikes, humps, or bumps cause excessive erosion and dishing during successive CMP steps and must be eliminated or minimized. Other prior art ECD tools, such as the one disclosed in U.S. Pat. No. 6,176,992 by Talieh, employ brush plating. The brush rubs the substrate's surface during plating. This is claimed to result in more planar plating after filling the openings. However, the continuous rubbing generates particulates due to wear of the brush or pads, or from the depositing metal.

Also, prior art ECD tools and methods often rely on wafer rotation to improve axial uniformity. However, unless certain strict conditions (such as no edge effects, infinite wafer's radius, infinite electrolyte volume, low plating ion concentration, and laminar flow) are satisfied, the wafer rotation creates non-uniform electrolyte flow across its surface. While electrolyte flow is slow at the center of the wafer, its (tangential) velocity increases with the radius. That velocity difference increases with rotation speed. As a result, the thickness of the diffusion layer varies as a function of the radius R (cf. 22 in FIG. 2). It has a maximum at the center of the wafer and gradually decreases along the radius, toward the edge of the wafer. The non-uniform diffusion layer produces severe non-uniformity of the plated layer along the radius of the wafer. It may also lead to deleterious voids in ECD-filled openings (such as trenches or vias) at certain radii of the wafers. These problems become more severe with increasing rotation speed and wafer diameter.

SUMMARY OF THE INVENTION

Embodiments of the present invention advantageously satisfy the above-identified need in the art and provide enhanced electrochemical deposition (ECD) void-free filling of a metal or an alloy inside openings in a substrate.

One embodiment of the invention is a method for void-free filling a metal or an alloy inside openings by electrochemical deposition (ECD), said method comprising steps of: (a) providing a substrate with at least one opening and a field surrounding the at least one opening, said at least one opening having surfaces, said substrate comprising an electrically conductive surface, said conductive surface comprising at least one surface of the at least one opening; (b) immersing the substrate in an electrolyte contained in an electrochemical deposition (ECD) cell, the ECD cell comprising at least one anode and a cathode, wherein the cathode comprising at least a portion of the conductive surface of the substrate, and wherein the electrolyte comprises plating metallic ions and at least one inhibitor additive, said metallic ions and said at least one inhibitor additive having concentrations; (c) providing agitation of the electrolyte across the surface of the substrate immersed in the electrolyte; and (d) applying electrical current between the at least one anode and the cathode to generate an average electroplating current density on the substrate; wherein the agitation, the concentrations of the metallic ions and the at least one inhibitor additive, and the average electroplating current density are such as to produce void-free, electroplated metallic filling of the at least one opening, and wherein a height of electrodeposited surface bumps, or transition steps or humps, or transition spikes is less than 140 nm.

One goal of the invention is to improve void-free filling of narrow openings by enhancing inhibition at the field and top corners during electroplating, while reducing inhibition inside the openings.

Another goal is to create as large as possible concentration difference (or gradient) of the inhibitor between the field and along the depth of the openings, by depleting the inhibitor inside the openings and by enhancing supply and concentration of inhibitor(s) at the field and top corners of the openings.

Another goal is to improve plating throughput and process latitude.

Yet another goal is to improve plating uniformity and void-free filling along the radius of plated wafers.

IN THE DRAWINGS

FIG. 1 shows a schematic cross section of a high aspect ratio opening filled by prior art ECD. The undesirable void is produced by faster plating rate at the field and top corners than inside the opening.

FIG. 2 compares schematic (i.e., models of) diffusion layer thickness profiles across a wafer diameter, produced by prior art ECD tools and methods and by the inventive methods.

FIG. 4 shows SEM photographs of two cleaved samples with void-free Cu-filled trenches, using a JECD tool at 120 mA/cm$^2$, in accordance with the invention. One sample shows partial fill and the other shows complete filling of the trenches.

FIG. 5 shows a typical AFM trace taken at a boundary between the field and a patterned trench array, over a Cu surface plated by a conventional prior-art ECD tool.

FIG. 6 shows a schematic (not to scale) inhibition model of brightening and/or leveling mechanism.

FIG. 7 shows a SEM photograph of lightly etched cross section of void-free Cu-filled trenches by a JECD tool, in accordance with the invention. The trenches are ~0.05 µm wide (at their bottom), ~1.41 µm deep, and have aspect ratio of about 28:1.

DESCRIPTION OF THE PREFERRED EMBODIMENTS

In general, prior art ECD tools utilize a relatively slow ("natural" or "laminar") flow of the electrolyte across the surface of the substrate (or wafer). The slow flow results in a relatively thick stagnant diffusion (or boundary) layer. The thickness of the diffusion layer decreases with the velocity of the electrolyte across the surface of the substrate. In prior art ECD tools, used for copper filling of integrated circuits interconnects, the diffusion layer is typically about 20-100 µm thick. Also, the prior art ECD tools and methods often rely on wafer rotation to improve axial uniformity. However, unless certain strict conditions (such as no edge effects, infinite wafer's radius, infinite electrolyte volume, low plating ion concentration, and laminar flow) are satisfied, the wafer rotation creates non-uniform electrolyte flow across its surface. For example, edge effects are always present due to the wafer holding fixture, plating ion concentration is high, electrolyte volume is small, and rotation speed of more than about 80 revolutions per minute (RPM) of 300 mm wafers produces non laminar flow near the edge. As a result, prior art ECD tools and methods usually produce a mix of laminar and some turbulent flows.

Figure 1:
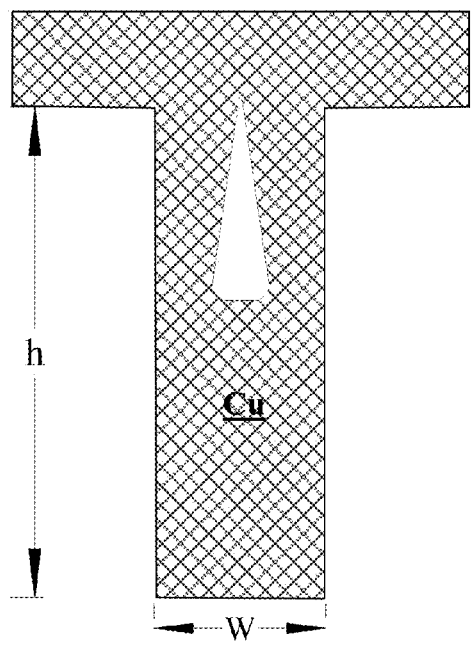
Figure 2:
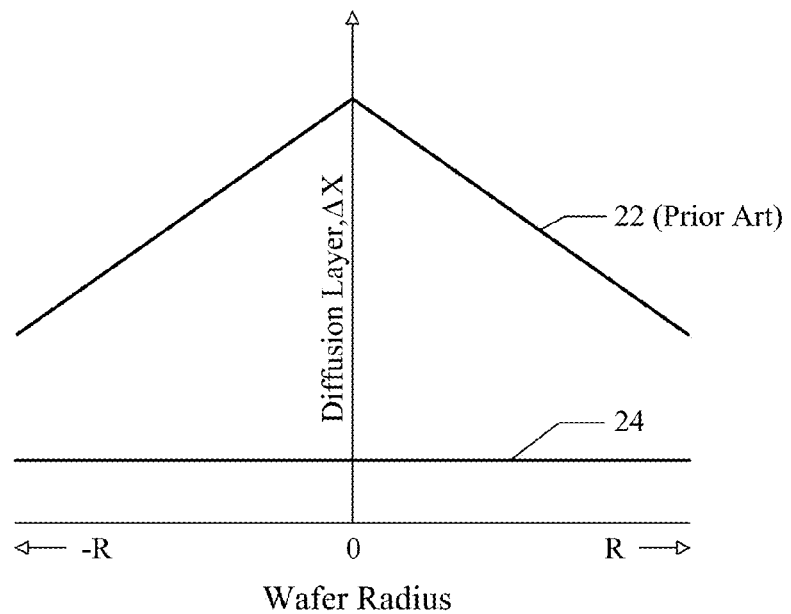

FIG. 2 shows schematic (not to scale i.e., models of) distribution profiles of the diffusion layer thickness ΔX across a wafer, corresponding to prior art tools and methods 22 and the inventive methods 24, respectively. Due to wafer rotation in the prior art ECD tools, electrolyte flow at the center of the wafer is slow, but the flow (tangential) velocity increases with the radius R. As a result, the diffusion layer thickness ΔX varies as a function of the radius (cf. 22). It has a maximum at the center of the wafer and decreases along the radius, toward the edge of the wafer. The non-uniformity of the diffusion layer becomes worse with increasing rotation speed and wafer diameter. The non-uniform diffusion layer produces severe non-uniformity of the plated layer along the radius of the wafer. It may also lead to deleterious voids (cf. FIG. 1) in ECD-filled openings (such as trenches or vias), at certain radii of the wafers. These problems become more severe with increasing wafer rotation speed and diameter. In contrast, the inventive methods and apparatus produce substantially uniform vigorous agitation, resulting in much thinner and uniform diffusion layer thickness across the wafer (cf. 24). Although the inventive methods may also utilize wafer rotation (to improve axial uniformity), the rotational flow component is relatively small, compared with the other vigorous flow components.

In a preferred embodiment, uniform vigorous electrolyte agitation at the field outside openings is produced, for example, by using high pressure Jets ECD (JECD), such as disclosed in U.S. Pat. No. 5,421,987 (Jun. 6, 1995), by Tzanavaras and Cohen, incorporated herein by reference. The powerful high pressure jets agitation can readily reduce the field diffusion layer thickness by an order of magnitude, to about 2-10 µm, or less, thereby significantly enhancing replenishment of the inhibitor at the field. At the same time, the electrolyte remains essentially stagnant inside narrow openings, thus leading to local depletion of inhibitor there. In addition, the vigorous jets agitation also mitigates non-uniformity of the diffusion layer thickness along the wafer's radius, due to wafer (or anodes/jets assembly) rotation. The powerful turbulent jets flow is much more prevalent than the rotational flow.

Example 1

Limiting current measurements (of plating current saturation at increasing cathode voltage) were taken with and without jets flow, using a jets ECD (JECD) tool similar to the one disclosed in U.S. Pat. No. 5,421,987. The acidic copper electrolyte did not include any inhibition organic additives. It consisted of 0.3M $CuSO_4$, 10% (v/v) $H_2SO_4$, and ~60 ppm chloride ions. In one measurement, a "natural" flow of about 2 gallons per minute (GPM) was used through an inlet at the bottom of the plating cell. The observed limiting current density, $i_L$, was about 55 $mA/cm^2$. In another measurement, a high pressure of 40 pounds per square inch (PSI) jets flow of 2.8 GPM was used with anode/jets assembly (AJA) rotation speed of 20 RPM, under otherwise identical conditions to the first measurement. The distance between the jet nozzles and the wafer was about 1". A limiting current $i_L$ could not be reached even at current density as high as 733 $mA/cm^2$. Further increase of the cathode voltage merely increased (linearly) the plating current without any signs of approaching saturation. This represents a factor of at least 13× higher limiting current using the jets flow, compared with the "natural" flow. The limiting current is inversely proportional to the diffusion layer thickness:

$$i_L = KC/\Delta X$$

where K is a constant and C is the plating ion (bulk) concentration. These measurements indicate that the diffusion layer thickness can be reduced by at least an order of magnitude using powerful high pressure turbulent jets flow, compared with that of "natural" flow; to about 2-10 µm, or less.

Due to strong damping of the jets flow in the bath, ΔX and $i_L$ are sensitive to the (inlet) jets pressure and to the distance between the jet nozzles and the substrate's surface. The higher the jets pressure and the closer the substrate's surface to the jet nozzles, the thinner is ΔX and the larger is $I_L$. For reasons of system integrity, avoiding device damage by the jets, pump cost, and heat generation, a pressure range of 30-50 PSI is preferred. The distance between the substrate's surface and the jet nozzles is optimized between conflicting requirements. On one hand it is desirable to shorten this distance as much as possible, in order to mitigate bath damping and to achieve powerful jets impinging on the substrate. On the other hand, the overlapping area on the substrate covered by neighboring jets is reduced with the distance between the nozzles and the substrate. Lack of sufficient overlap between the jet cones leads to periodic non-uniformity across the substrate. The preferred optimized distance between the nozzles and the substrate is in the range of about 0.5-2.0", and more preferably in the range of 0.75-1.5".

FIGS. 3a-3h show schematic (not to scale i.e., models of) comparisons between prior art ECD filling, and the enhanced void-free ECD filling of the present invention. Inhibitor additives are used in both cases. Plating inhibition (or suppression) can be produced by many surface active materials (adsorbates) which adsorb onto the surface of the plating metal or alloy.

Figure 3A:
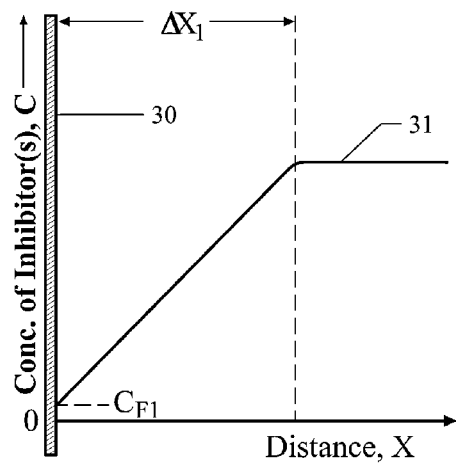
FIGS. 3a-3h show schematic (i.e., models of) comparisons between prior art ECD plating and by the enhanced void-free filling methods and apparatus of the present invention.
Figure 3B:
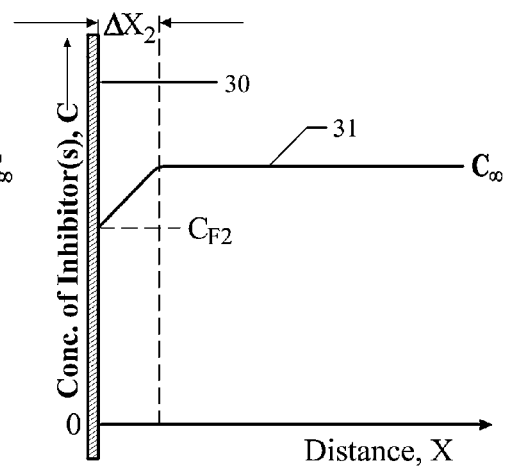

FIGS. 3(a) and 3(b) compare inhibitor concentration profiles 31, of prior art ECD methods and/or tools, and the present invention, respectively. Concentration profiles 31 are shown as a function of the distance X into the electrolyte, adjacent to a flat substrate surface 30. The prior art diffusion layer thickness ($\Delta X_1$) is much larger than that produced by the inventive methods of the present invention ($\Delta X_2$):

$$\Delta X_1 \gg \Delta X_2$$

During electroplating, inhibitor is consumed at the advancing deposit surface, thereby depleting its interface concentration. The interface concentration is smaller than the bulk concentration, $C_\infty$. A concentration gradient of the inhibitor is thus established across the (stagnant) diffusion layer. Due to much thinner diffusion layer of the inventive methods, the inhibitor flat (or field) interface concentration ($C_{F2}$) of the inventive methods is much larger than that of prior art ($C_{F1}$):

$$C_{F2} \gg C_{F1}$$

Figure 3C:
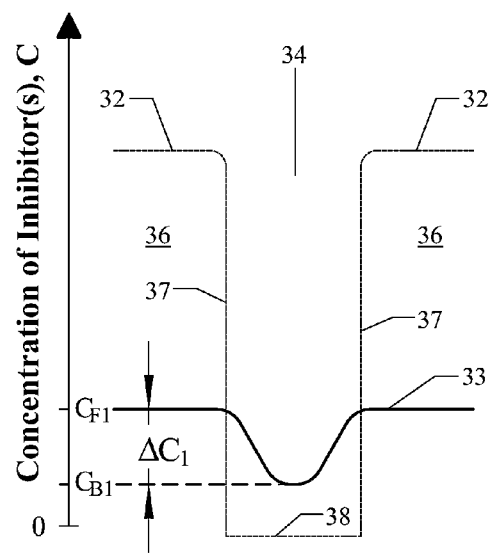
Figure 3D:
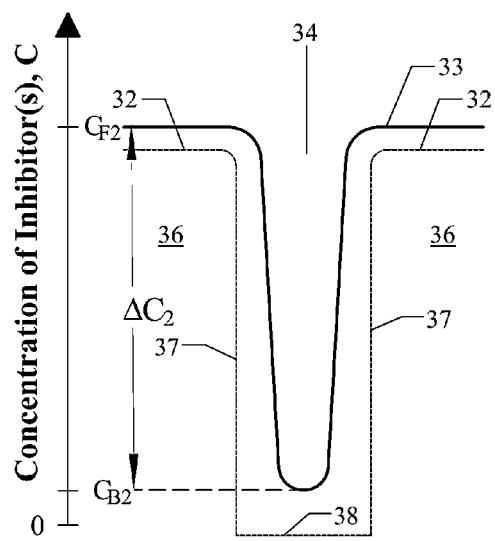

FIGS. 3(c) and 3(d) compare the inhibitor concentration profiles 33 inside a narrow opening 34, and at adjacent field 32 outside the opening. FIGS. 3(c) and 3(d) correspond to conventional prior art ECD methods and/or tools, and to the inventive methods, respectively. As is well known to those skilled in the art, multiplicity of openings, such as opening 34, are etched in a dielectric (or insulating) material 36 prior to electroplating. Although the description herein relates sometimes to a single opening 34, it should be understood by those skilled in the art that the same description also applies to multiplicity of openings 34. Similarly, although the description herein refers to a single inhibitor, it should be understood by those skilled in the art that the same description also applies to multiplicity of inhibitors. Opening 34 includes sidewall surfaces 37 and bottom surface 38. Also as well-known, prior to electroplating, a metallic barrier layer and a copper seed layer (not shown) are formed by dry deposition techniques, such as by physical vapor deposition (PVD) or by chemical vapor deposition (CVD). The metallic barrier and the Cu seed layer must be continuous over the surfaces of sidewalls 37 and bottom 38 of openings 34, as well as over the field 32. The barrier layer usually comprises a refractory metal (such as Ta or Ti) or an alloy comprising a refractory metal (such as $TaN_X$ or $TiN_X$). The barrier layer serves two functions: to minimize out-diffusion of Cu into the dielectric material 36 and/or into the underlying semiconductor device (not shown), and to improve adhesion between dielectric material 36 and the Cu seed layer. The Cu seed layer provides low electrical resistance path on the surface, required for the electroplating.

FIGS. 3(c) and 3(d) show that during electroplating, due to a substantially stagnant electrolyte inside opening 34, the inhibitor is greatly (or fully) depleted near the bottom 38 of opening 34. The inventive methods aim to enhance replenishment of the inhibitor at the top field surface 32. They produce much larger inhibitor's concentration at the field than that obtained by prior art: $C_{F2} \gg C_{F1}$. Inhibitor concentration variances (between the field 32 and the opening's bottom 38) are defined herein:

$\Delta C_1 = C_{F1} - C_{B1}$ (cf. FIG. 3(c); prior art)
$\Delta C_2 = C_{F2} - C_{B2}$ (cf. FIG. 3(d); present invention)

Clearly, the concentration variance (or difference) obtained by the inventive methods is much larger than that obtained by prior art: $\Delta C_2 \gg \Delta C_1$. The inventive methods greatly enhance inhibition (and slowing-down) of electroplating rate at the field 32, relative to inside opening 34.

Figure 3E:
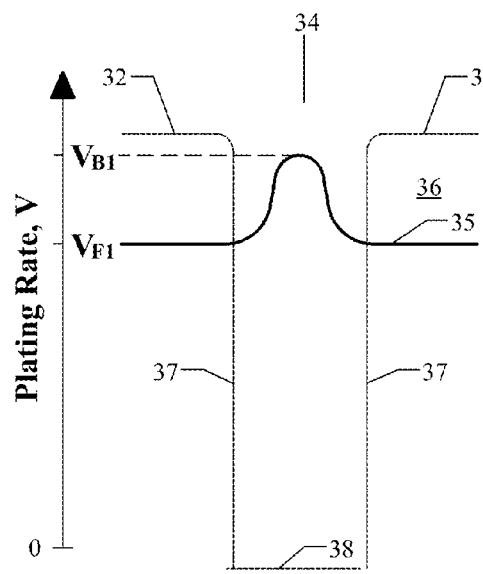
Figure 3F:
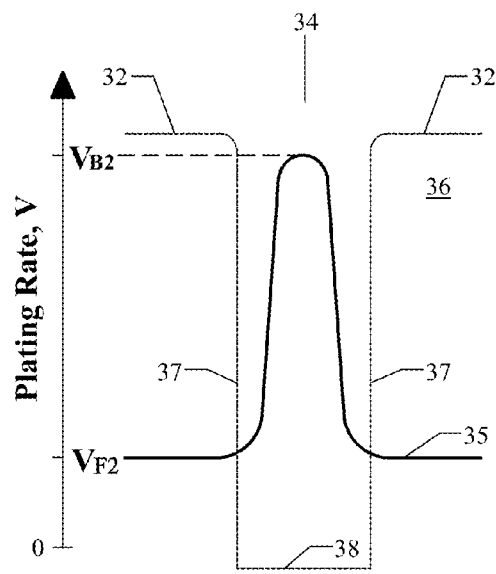

FIGS. 3(e) and 3(f) show plating rate profiles 35 obtained by prior art ECD methods and tools, and by the inventive methods, respectively. Due to essentially stagnant and small volume (and large area/volume ratio) of the electrolyte inside the opening, the plating depletes the inhibitor there. This depletion establishes concentration gradients of the inhibitor along the sidewalls (depth) of the opening, with maximum depletion at the bottom 38. The degree of inhibition inside opening 34 decreases gradually along its depth and has a minimum near its bottom 38. This results in maximum plating rate near bottom 38, and slower plating rate at the field 32 and top corners. Plating rate variances (between opening's bottom 38 and field 32) are defined herein:

$\Delta V_1 = V_{B1} - V_{F1}$ (cf. FIG. 3(e); prior art)
$\Delta V_2 = V_{B2} - V_{F2}$ (cf. FIG. 3(f); present invention)

Positive plating rate variance ($\Delta V > 0$) facilitates void-free filling (or "superfilling") of narrow openings. The larger this variance, the more pronounced and prevalent the superfilling mechanism. While prior art ECD methods and tools provide relatively small (or marginal) plating rate variance, the inventive methods produce much larger variance: $\Delta V_2 \gg \Delta V_i$. In other words, prior art ECD methods and tools produce only slightly larger plating rate at the bottom 38 than at the field 32: $V_{B1} \gtrsim V_{F1}$. In fact, due to inherent competing void-forming mechanisms, they often result in negative variance: $\Delta V_1 \lesssim 0$. In contrast, the inventive methods greatly enhance inhibition at the field 32 and top corners, thereby significantly slowing-down the plating rate there (relative to bottom 38): $V_{B2} \gg V_{F2}$. The inventive methods aim at producing large plating rate variance: $\Delta V_2 \gg 0$. They thus overcome inherent void-forming mechanisms (due to higher electric field at the top corners and due to depletion of plating ions inside openings). These inherent void-forming mechanisms produce negative plating rate variance ($\Delta V < 0$), leading to pinching-off of the top corners, and to void-formation. The inventive methods significantly enhance void-free superfilling by generating a large and positive $\Delta V_2$. This large variance also facilitates wider process latitude, such as wider useful ranges of inhibitor concentration and plating rates.

Figures 3G, 3H:
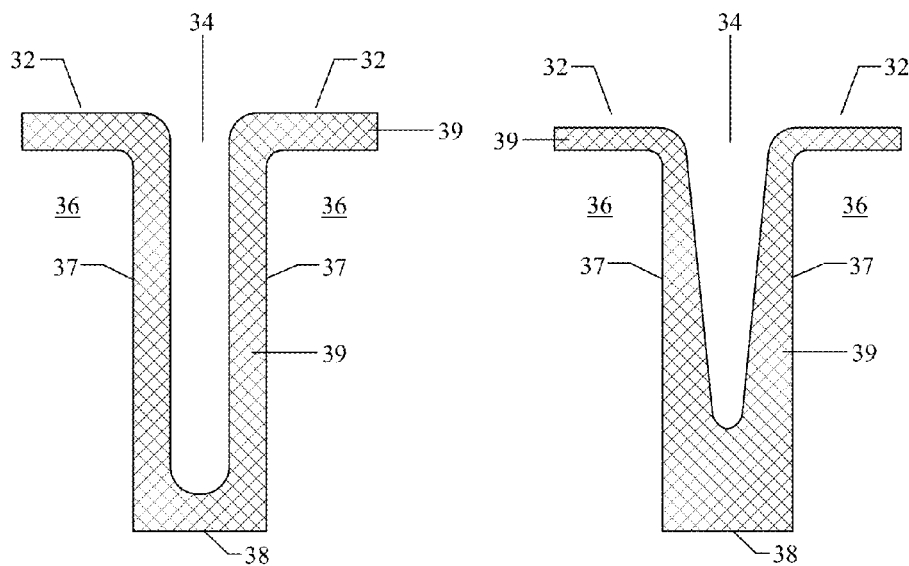

FIGS. 3(g) and 3(h) show filling profiles 39 obtained by prior art ECD methods and tools, and by the inventive methods, respectively. While prior art methods and tools produce conformal (or marginally filling) profiles which often lead to seam-voids, the inventive methods produce much more pronounced superfilling profile. Robust prevalent superfilling is the result of significantly slower plating rate at the field 32 and top corners, with a pronounced maximum near bottom 38, as shown in FIG. 3(f). Such a plating rate profile facilitates progressive sealing of narrow openings without seam-voids ("superfilling"). This sealing proceeds like a zipper, from bottom to top, where most of the filling is due to lateral sidewall growth.

Example 2

FIG. 4 shows scanning electron micrographs (SEM) of two cleaved samples with Cu-superfilled trenches, in accordance with a preferred embodiment of the invention. Both samples were plated by a jets ECD (JECD) tool, similar to the one disclosed in U.S. Pat. No. 5,421,987. Both samples were plated with current density of 120 mA/cm$^2$ (plating rate of about 2.8 µm/min). FIG. 4(a) shows a sample in which the plating was terminated prior to completion (partially filled trenches), thereby revealing the superfilling profile. The growth profiles on the bottom and sidewalls in FIG. 4(a) correspond well with the superfill model FIG. 3(h). The plating rate is fastest at the bottom (maximum depletion and minimum inhibition) and is slowest at the top (minimum depletion and maximum inhibition) of the openings. It is the plating rate gradients, along the depth of the openings, which facilitate void-free filling of narrow openings. The model and the experimental results imply that, in very narrow openings (with large aspect ratios), most of the filling is due to lateral growth components, substantially normal to the sidewalls.

This explains why narrower openings fill earlier than wider openings. Almost one half of the upper width of the opening has to grow laterally, in order to seal the opening. The sealing of the opening proceeds like-a-zipper, from bottom to top. FIG. 4(b) shows a sample in which the plating was terminated some time after complete filling of the trenches. Note the flat smooth Cu-plated surface and the lack of any bumps above filled openings. No plating voids were found in either of these samples. The jets pressure was 40 PSI, and rotation speed of the anodes/jets assembly (AJA) was 20 RPM. The distance between the wafer and the nozzles was about 1", and a backing flat plastic plate was placed at the back of the wafer in order to avoid wafer buckling under the powerful jets. The acidic copper sulfate electrolyte was similar to the one described in Example 1, and further included proprietary two-component ("Gleam-PPR") additive system from Shipley-Lea Ronal Company.

The powerful jets agitation enhances replenishment of inhibitor at the field, while inside the narrow openings the electrolyte remains essentially stagnant. The impinging powerful jets create vigorous turbulent agitation at the wafer's surface, thereby significantly reducing the diffusion layer thickness, $\Delta X_2$, as seen in FIG. 3(b). During electroplating, the faster plating rate at the bottom 38 facilitates the desirable void-free filling (or "superfilling") profile, as shown in FIGS. 3(h) and 4(a).

The powerful jets agitation provides another important advantage. It facilitates significant increase of the plating rate without "burning" the deposit. It was found that the plating rate could be safely increased to 2.8 μm/min, without any deleterious effects. This is about 8× faster than typical prior art plating rate of about 0.35 μm/min. It facilitates more than double the throughput per module, at no extra cost. In fact, it was found that the surface becomes brighter by increasing the plating rate. At 2.8 μm/min, wafers appear fully bright (cf. FIG. 4(b)). However, the surface brightness and roughness of the plated Cu layer is also a strong function of the seed layer. Some seed layers result in significantly rougher plated Cu than others.

FIG. 5 shows an atomic force microscope (AFM) trace, taken over the surface of a wafer which was Cu-plated using a conventional prior-art tool (Novellus Systems, Inc). The AFM trace was taken over a border between flat field and an array of trenches of 0.35 μm/0.35 μm lines/spaces. The wafer was plated to a nominal thickness of 1.5 μm. The AFM trace shows a large spike (~520 nm) and an elevation step (~250 nm) at the border.

Example 3

Using a JECD tool as in Example 2, two wafers were plated at low and high plating rates. All other plating parameters (or variables) were identical to those in Example 2. As in FIG. 5, the wafers had patterned arrays of 0.35/0.35 μm lines/spaces, and were plated to a nominal thickness of 1.5 μm. The first sample was plated at low current density (15 mA/cm² or ~0.35 μm/min), and the second sample was plated at high current density (120 mA/cm² or ~2.8 μm/min). While the lower plating rate produced a small step (or hump) of about 140 nm at the field/array border, the sample plated at the higher rate revealed no transition spike or step at all. For comparison, FIG. 5 shows that a wafer plated by a prior art tool had a large spike (~520 nm) and elevation step (~250 nm) at the border. Surface roughness of JECD plated samples was measured by AFM. While the mean surface roughness (Ra) of a low current (15 mA/cm²) sample was 11.2 nm, that of a sample plated at the higher current (120 mA/cm²) was only 7.3 nm.

JECD plating did not require any additional (third component) "leveler" organic additive, or the use of a complex pulse or periodic reversal pulse plating, in order to eliminate the spikes and steps common in prior art ECD plating. As disclosed in an article by Reid et al. in Journal of Solid State Technology, Vol. 43(7), pp. 86-103, July 2000, and in an article by Mikkola et al. in 2000 International Interconnect Technology Conference (IITC), pp. 117-119, June 2000, addition of a third component "leveler" additive greatly complicates the required bath analysis and control. It may also result in top center voids and poor filling of larger features. As disclosed in an article by Gandikota et al. in 2000 International Interconnect Technology Conference (IITC), pp. 239-241, June 2000, and in an article by Hsie et al. in 2000 International Interconnect Technology Conference (IITC), pp. 182-184, June 2000, pulse plating, and in particular periodic reversal (PR) plating, slows-down the throughput and further complicates the required control. It may also result in larger grains, rougher surface, and longer self-anneal time of the plated Cu films.

FIG. 6 shows a schematic inhibition model explaining the improved JECD leveling and brightness with increasing plating rate. At low current density (15 mA/cm²), there is only small depletion ($\Delta C_{15}$) of the inhibitor at the wafer's interface. As a result, there is very little or no inhibition differentiation between a growing protrusion and the flat surface. Due to higher concentration of the plating ions ahead of the flat interface, protrusions (after exceeding a critical size) can continue to grow faster than the flat surface. This leads to amplification of the protrusions and surface roughening. At high plating rate, the high current density (105 mA/cm²) creates larger (or deeper) depletion ($\Delta C_{105} \gg \Delta C_{15}$) of the inhibitor at the (flat) wafer interface. The tip of a growing protrusion "sees" significantly larger concentration of the inhibitor than the flat surface. Protrusions which stick into the diffusion layer are suppressed (or inhibited) by the higher concentration of the inhibitor ahead of the flat surface. The flat surface, on the other hand, "sees" deeper depletion (or lower concentration) of inhibitor as the current density increases, thus enhancing its deposition rate (relative to protrusions). As described in an article by Cohen et al. in 2000 Proc. 17$^{th}$ Intl. VLSI Multilevel Interconnect Conference (VMIC), pp. 21-26, June 2000, and in the article by Hsie et al., the enhanced suppression of protrusions at higher current densities leads to smoother and brighter deposits.

The common prior art humps or bumps are due to coalescence of individual micro-bumps (above the top corners of openings) into larger bumps or humps, associated with insufficient leveling or brightening. The coalesced bumps or humps continue to amplify and grow faster than the flat field, since they "see" larger concentration of the plating ions ahead of the flat field. The inventive methods improve leveling, thereby reducing or eliminating the bumps and humps. The most important factor for leveling (for a given chemistry of additives and their bulk concentrations) is to create a large concentration gradient across the diffusion layer ($\Delta C_{inh}/\Delta X$). In accordance with the invention, this is achieved by increasing the current density (larger $\Delta C_{inh}$) and by the powerful vigorous jets agitation (smaller $\Delta X$).

As openings get narrower, the ratio of surface area (A) to volume (V) of the opening becomes larger. This ratio is reciprocal to W, the diameter of vias or width of trenches:

$$A/V \propto 1/W$$

A larger ratio A/V results in faster depletion of the inhibitor inside the openings. In other words, it takes less time (keeping all other parameters the same) to establish the inhibitor depletion gradients inside the opening. This, in turn, results in thinner transitional conformal growth on the bottom and sidewalls, prior to superfill commencement. As described by the articles of Andricacos, and Andricacos et al., growing conformal and non-conformal (or anti-conformal) layers on the sidewalls lead to deleterious seam-voids in the center of trenches or vias (cf. FIG. 1). Their thickness must be minimized in order to achieve void-free filling. Thus, it is actually easier to deplete the inhibitor inside narrower openings! However, even complete depletion inside the openings does not guarantee void-free filling. The latter requires both, depletion of inhibitor inside the opening and sufficient supply of it at the top field. Without the latter, $\Delta C_{inh}$ between the field and the inside of the opening becomes too small to enable the superfill mechanism. This is where the inventive methods become so beneficial. The powerful jets of JECD and/or brush wiping enhance considerably the supply of inhibitor to the field (compared with prior art tools and methods), thereby significantly increasing $\Delta C_{inh}$. The larger $\Delta C_{inh}$ produced by the inventive methods enables superfilling of even the narrowest (as well as the wider) openings, with wide process latitude.

Example 4

FIG. 7 shows a scanning electron micrograph (SEM) of a cleaved sample plated by a JECD tool, in accordance with the invention. The photo shows void-free filled trenches which were only about 0.05 μm wide (at their bottom), about 1.41 μm deep, and had aspect ratio of about 28:1. The plating current density was 30 mA/cm². All other plating parameters were the same as in Examples 2 and 3. These are currently the narrowest (with largest AR) void-free ECD Cu-filled trenches ever demonstrated.

Figure 8:
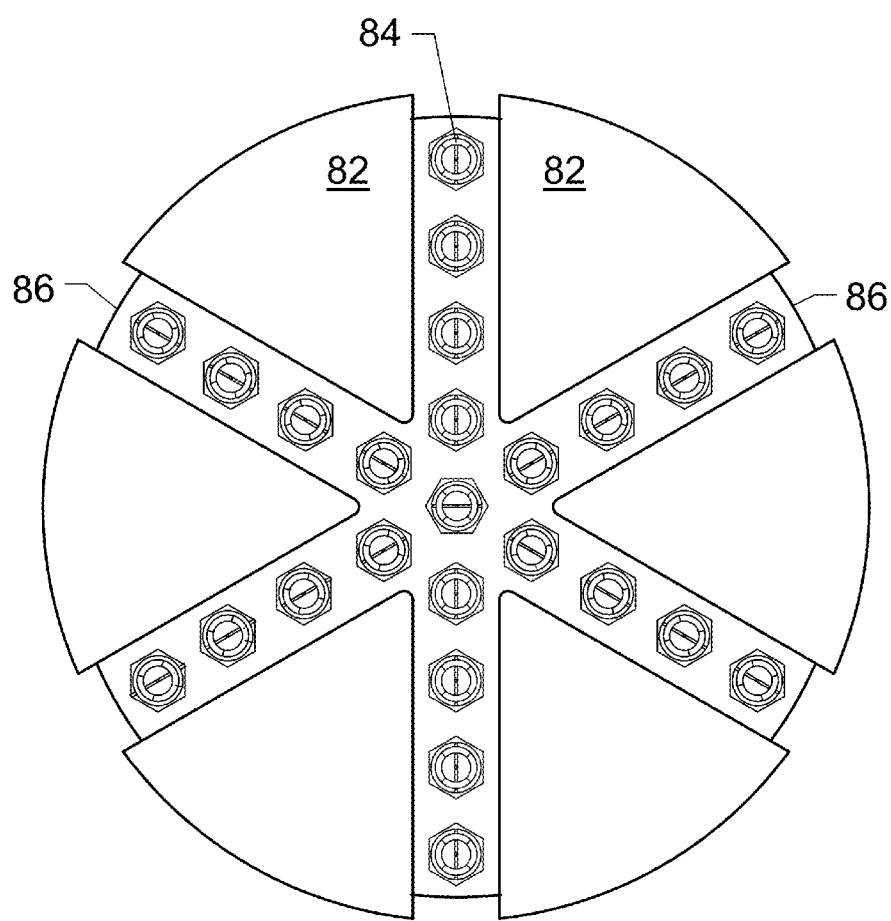
FIG. 8 shows an anodes/jets-nozzles assembly in accordance with embodiments of the invention. Vigorous agitation is produced by high pressure jets flow.

FIG. 8 shows a preferred embodiment enhancing inhibitor supply to the field, using a JECD apparatus similar to the one disclosed in U.S. Pat. No. 5,421,987. Anode segments 82 and jet nozzles 84 are assembled in a manner to provide high pressure jets producing uniform powerful and vigorous turbulent flow of electrolyte over the surface of a facing substrate (not shown). The nozzles 84 are assembled on a platen 86. Anode segments 82 may consist of a single copper sheet or a multiplicity of copper pieces electrically connected together. In order to improve axial uniformity, either the anodes/jets assembly (AJA) rotates and the substrate is held stationary, or the substrate rotates and the AJA is held stationary. Alternatively, both the AJA and the substrate rotate in opposite directions. The plating cell configuration may be horizontal or vertical. In the horizontal configuration the substrate (wafer) is either facing down or is facing up the AJA. In the vertical configuration both the wafer and the AJA face each other in a vertical configuration. The powerful jets produce significantly enhanced supply of inhibitor to the field, while maintaining substantially stagnant electrolyte inside narrow openings.

Figure 9:
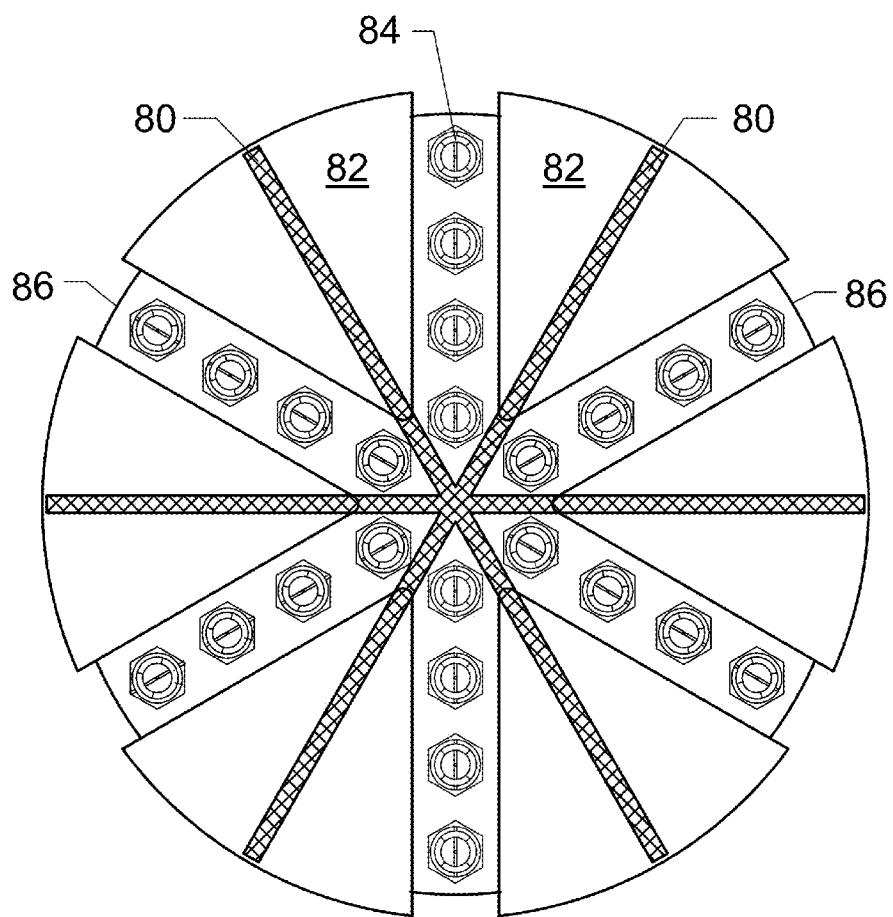
FIG. 9 shows an anodes/jets-nozzles assembly in accordance with embodiments of the invention. Vigorous agitation is produced by high pressure jets flow and/or by mechanical means, such as wiping brushes (or pads), or by a combination of jets and wiping brushes to enhance inhibitor supply to the field.

FIG. 9 shows alternative embodiments in which enhanced inhibitor supply to the field is produced by wiping brushes (or pads, or wiper blades) 80. During electroplating, the brushes and/or the substrate move or rotate relative to, or across, each other in a manner to provide mechanical wiping between the brushes (or pads, or wiper blades) and the surface of the substrate (not shown). Although the description herein relates sometimes to brushes (or pads, or blades), it should be understood by those skilled in the art that the same description also applies to a single brush (or a pad, or a wiper blade). The mechanical wiping removes depleted electrolyte from the field surface, thereby enhancing replenishment of fresh (with undepleted inhibitor) electrolyte to the field. At the same time, electrolyte inside narrow openings remains essentially stagnant and unremoved by the wiping brush (or pad, or wiper blade), thus leading to local depletion of inhibitor there. The wiping pad (or blade, or brush) does not have to actually make continuous contact with the surface of the substrate. It is sufficient to move it (or to move the substrate relative to it) within close proximity to the substrate's surface, in order to obliterate the relatively thick diffusion layer established prior to the wiping action. For example, a wiping blade (or pad or brush) within a distance of about 5-50 μm from the substrate surface is sufficient to wipe out and obliterate the diffusion layer from the field and replenish it with fresh solution containing full inhibitor concentration. Non-contacting, or slightly contacting, wipe has the advantage of avoiding particulate formation due to rubbing between the wipe and the substrate's surface. A non-contacting wipe can be obtained, for example, by hydrodynamically floating the wipe over the substrate's surface, similar to floating magnetic heads over rotating disks, or by shaping the wipe to float as an hydrofoil or hydroplane.

In one embodiment, brushes (or pads, or blades) 80 alone, without jet-nozzles 84, produce significantly enhanced supply of inhibitor to the field, while maintaining substantially stagnant electrolyte, containing depleted inhibitor, inside narrow openings. The relative wiping motion does not have to be rotational. It may also be linear (not shown).

In another embodiment, both high pressure jets (using jet-nozzles 84) and wiping brushes (or pads, or blades) 80 are combined together to produce the benefits of both methods. They produce significantly enhanced supply of inhibitor to the field, while maintaining substantially stagnant electrolyte (containing depleted inhibitor) inside narrow openings. The relative wiping motion does not have to be rotational. It may also be linear (not shown).

In yet another embodiment, ultrasonic or megasonic agitation (not shown), with or without brushes 80 and/or jet-nozzles 84, produces significantly enhanced supply of inhibitor to the field, while maintaining substantially stagnant electrolyte inside narrow openings.

The inventive methods increase the concentration gradients of the inhibitor, $\Delta C_{inh}/h$, along the depth (h) of the opening, thus producing larger inhibition gradient from the field to the bottom of the opening. The larger this gradient, the more effective and prevalent the superfill mechanism. At large enough gradient, even the narrowest opening can be filled without voids. At the same time, increasing this gradient also facilitates wider process latitude. For example, utilizing a JECD tool, it was possible to obtain simultaneous void-free filling of very narrow, as well as wide openings, while using wide range of plating rates (0.35-2.8 μm/min). Similarly, using a JECD tool, it was possible to vary the nominal additive concentration by more than 100%, without deleterious effects.

Other embodiments of the invention provide for one or more of the following: (a) increasing the global plating rate (in order to facilitate depletion of inhibitor inside openings); (b) narrowing the openings and/or increasing their aspect ratio (in order to facilitate depletion of inhibitor inside openings); (c) decreasing the bulk inhibitor concentration (in order to facilitate depletion of inhibitor inside openings); and (d) increasing adsorption strength (and inhibition effectiveness) by selecting at least one powerful inhibitor (or adsorbate).

However, it should be understood by those skilled in the art that there are optimal ranges for these variables which may intricately depend on each other. For example, while increasing the global plating rate facilitates depletion of inhibitor inside the openings, it also increases depletion of the inhibitor at the field. This may in turn require higher inhibitor bulk concentration. Therefore, the optimal range of plating rate is strongly dependent upon inhibitor concentration. Similarly, although depletion is faster inside narrower openings (with larger AR), inherent void-forming effects (due to higher electric field at the top corners and plating ion depletion inside the openings) are stronger with such openings. Also, while decreasing bulk inhibitor concentration helps depletion inside the openings, it may result in insufficient concentration at the field, thereby adversely affecting void-free filling. Thus, too low or too high inhibitor bulk concentration or global plating rate may result in insufficient inhibitor gradients for successful void-free filling. Too low inhibitor concentration may result in insufficient field concentration, thereby producing too small inhibitor gradients. Too high inhibitor bulk concentration may result in insufficient depletion inside the openings, thereby leading to too small inhibitor gradients. Similarly, too low plating rate may not be sufficient to deplete the inhibitor inside the openings, while too high plating rate may deplete too much the field. Therefore, the optimal ranges of these variables are intricately dependent on each other. They must be optimized in concert with each other.

It should be understood that the above-described embodiments can be used to fabricate any number of devices including, and without limitation, metallic interconnects in semiconductor integrated circuit devices, thin film heads, micromachined Microelectromechanical Systems (MEMS) devices, or interconnects in high density electronic packages (such as chip scale and wafer scale packaging).

Those skilled in the art will recognize that the foregoing description has been presented for the sake of illustration and description only. As such, it is not intended to be exhaustive or to limit the invention to the precise form disclosed.

What I claim is:

1. A method for void-free filling a metal or an alloy inside openings by electrochemical deposition (ECD), said method comprising steps of:
    (a) providing a substrate with at least one opening and a field surrounding the at least one opening, said at least one opening having surfaces, said substrate comprising an electrically conductive surface, said conductive surface comprising at least one surface of the at least one opening;
    (b) immersing the substrate in an electrolyte contained in an electrochemical deposition (ECD) cell, the ECD cell comprising at least one anode and a cathode, wherein the cathode comprises at least a portion of the conductive surface of the substrate, and wherein the electrolyte comprises plating metallic ions and at least one inhibitor additive, said metallic ions and said at least one inhibitor additive having concentrations;
    (c) providing agitation of the electrolyte across the surface of the substrate immersed in the electrolyte; and
    (d) applying electrical current between the at least one anode and the cathode to generate an average electroplating current density on the substrate;
    wherein the agitation, the concentrations of the metallic ions and the at least one inhibitor additive, and the average electroplating current density are such as to produce void-free, electrodeposited metallic filling of the at least one opening, and wherein a height of electrodeposited surface bumps, or transition steps or humps, or transition spikes is less than 140 nm.

2. The method of claim 1, wherein the average electroplating current density is between 15 mA/cm$^2$ and 120 mA/cm$^2$.

3. The method of claim 1 wherein the average electroplating current density is between 30 mA/cm$^2$ and 120 mA/cm$^2$.

4. The method of claim 1 wherein the average electroplating current density is between 60 mA/cm$^2$ and 120 mA/cm$^2$.

5. The method of claim 1 wherein a plating rate on the field is from about 0.35 μm/min to about 2.8 μm/min.

6. The method of claim 1 wherein the at least one opening has a width from about 0.05 μm to 0.13 μm.

7. The method of claim 1 wherein the at least one opening has a width from about 0.05 μm to 0.10 μm.

8. The method of claim 1 wherein the at least one opening has a width not more than 0.10 μm and an aspect ratio in a range from 2.5:1 to 28:1.

9. The method of claim 1 wherein the at least one opening has an aspect ratio in a range from 2.5:1 to 28:1, and wherein a mean surface roughness (Ra) of the electrodeposited metal or alloy at the field is not more than about 7.3 nm.

10. The method of claim 1 wherein a diffusion layer in the electrolyte adjacent the substrate has a thickness from about 2 μm to 50 μm.

11. The method of claim 1 wherein a diffusion layer in the electrolyte adjacent the substrate has a thickness from about 2 μm to 20 μm.

12. The method of claim 1 wherein a diffusion layer in the electrolyte adjacent the substrate has a thickness from about 2 μm to 10 μm.

13. The method of claim 1 wherein a mean surface roughness (Ra) of electrodeposited metal or alloy at the field is less than about 11.2 nm.

14. The method of claim 13 wherein the mean surface roughness is less than about 7.3 nm.

15. The method of claim 1, wherein the electrolyte comprises two or more different metallic ions, and the at least one opening is filled with an electroplated alloy.

16. The method of claim 1, wherein the plating metallic ions comprise copper ions.

17. The method of claim 16 wherein the electrodeposited metallic filling comprises copper or a copper alloy.

18. The method of claim 16 wherein the electrolyte contains no more than two organic additives.

19. The method of claim 1 wherein the at least one opening has an aspect ratio in a range from 8:1 to 28:1.

20. The method of claim 1 wherein the at least one opening has an aspect ratio in a range from 10:1 to 28:1.

21. The method of claim 1 wherein said providing agitation of the electrolyte comprises providing turbulent agitation of the electrolyte.

22. The method of claim 21 wherein at least a portion of the turbulent agitation is provided by electrolyte jets impinging on the substrate in a direction that is substantially normal to the substrate.

23. The method of claim 21 wherein at least a portion of the turbulent agitation is provided by moving one or more non-contacting wiping blades, or one or more non-contacting wiping pads, or one or more non-contacting wiping brushes, relative to the substrate, and/or by moving the substrate relative to one or more non-contacting wiping blades, or relative to one or more non-contacting wiping pads, or relative to one or more non-contacting wiping brushes.

24. The method of claim 21 wherein at least a portion of the turbulent agitation of the electrolyte is provided by ultrasonic or megasonic vibrations.

25. The method of claim 21 wherein at least a portion of the turbulent agitation is provided by a combination of two or more of: (a) electrolyte jets impinging on the substrate in a direction substantially normal to the substrate; (b) moving one or more non-contacting wiping blades, or one or more non-contacting wiping pads, or one or more non-contacting wiping brushes, relative to the substrate, and/or by moving the substrate relative to one or more non-contacting wiping blades, or relative to one or more non-contacting wiping pads, or relative to one or more non-contacting wiping brushes; and (c) ultrasonic or megasonic vibrations.

26. The method of claim 21 wherein at least a portion of the turbulent agitation is provided by moving multiple non-contacting wiping blades relative to the substrate, and/or by moving the substrate relative to the multiple non-contacting wiping blades.

27. The method of claim 1 wherein the height of electrodeposited surface bumps, or transition steps or humps, or transition spikes is less than 100 nm.

28. The method of claim 1 wherein at least a portion of the agitation of the electrolyte is provided by electrolyte jets impinging on the substrate in a direction that is substantially normal to the substrate, and moving the substrate relative to the jets and/or moving the jets relative to the substrate.

29. The method of claim 28 wherein the average electroplating current density is between 30 mA/cm$^2$ and 733 mA/cm$^2$.

30. The method of claim 1 wherein at least a portion of the agitation is provided by moving one or more non-contacting wiping blades, or one or more non-contacting wiping pads, or one or more non-contacting wiping brushes, relative to the substrate, and/or by moving the substrate relative to one or more non-contacting wiping blades, or relative to one or more non-contacting wiping pads, or relative to one or more non-contacting wiping brushes.

31. The method of claim 1 wherein at least a portion of the agitation is provided by moving multiple non-contacting wiping blades relative to the substrate, and/or by moving the substrate relative to the multiple non-contacting wiping blades.

32. The method of claim 31 wherein the average electroplating current density is between 30 mA/cm$^2$ and 733 mA/cm$^2$.

33. The method of claim 1 wherein the average electroplating current density is between 15 mA/cm$^2$ and 733 mA/cm$^2$.

34. The method of claim 1 wherein the average electroplating current density is between 30 mA/cm$^2$ and 733 mA/cm$^2$.

35. The method of claim 1 wherein the average electroplating current density is between 60 mA/cm$^2$ and 733 mA/cm$^2$.

36. The method of claim 1 wherein the average electroplating current density is between 120 mA/cm$^2$ and 733 mA/cm$^2$.

* * * * *